United States Patent [19]

Chang

[11] 3,996,571
[45] Dec. 7, 1976

[54] DOUBLE LAYER BUBBLE DOMAIN LATTICE SYSTEM

[75] Inventor: Hsu Chang, Yorktown Heights, N.Y.

[73] Assignee: International Business Machines Corporation, Armonk, N.Y.

[22] Filed: Mar. 8, 1974

[21] Appl. No.: 449,308

[52] U.S. Cl. .................. 340/174 TF; 340/174 EB; 340/174 VA
[51] Int. Cl.² ........................................ G11C 11/14
[58] Field of Search ............................. 340/174 TF

[56] References Cited

UNITED STATES PATENTS

| | | | |
|---|---|---|---|
| 3,643,238 | 2/1972 | Bobeck et al. | 340/174 TF |
| 3,836,898 | 9/1974 | Bobeck et al. | 340/174 TF |
| 3,994,842 | 3/1976 | Dorleign et al. | 340/174 TF |

FOREIGN PATENTS OR APPLICATIONS 7,110,674  2/1973  Netherlands ................ 340/174 TF

OTHER PUBLICATIONS

Applied Physics Letters–vol. 23, No. 8, Oct. 15, 1973, pp. 485–487.

American Institute of Physics Conference Proceedings, No. 5, Part 1, Nov. 16–19, 1971.

*Primary Examiner*—James W. Moffitt
*Attorney, Agent, or Firm*—Jackson E. Stanland

[57] ABSTRACT

A bubble domain lattice system in which information exists as the presence and absence of bubble domains. A lattice exists in a conveyor layer and lattice bubble domains are coupled (magnetostatically or by exchange forces) to information bubble domains in another magnetic layer (information layer). These information bubble domains are coded in accordance with their presence or absence in the information layer. When the bubble lattice domains in the conveyor layer are moved, corresponding bubble domains in the information layer move in a similar manner, due to the magnetostatic coupling. Consequently, the high density advantages of a lattice arrangement are achieved in the present system, while coding of information is achieved without having to require different types of magnetic bubble domains.

9 Claims, 10 Drawing Figures

FIG. 5
SHIFT REGISTERS SR1, SR2

FIG. 6

| CONDUCTOR CURRENT | | BUBBLE POSITION | | |
|---|---|---|---|---|
| | | A | B | C |
| | C5 | + | G | G |
| | C6 | G | + | G |
| | C7 | G | G | + |
| | C8 | + | + | + |

FIG. 7

DOUBLE LAYER BUBBLE DOMAIN LATTICE SYSTEM

BACKGROUND OF THE INVENTION

1. Field of the Invention

This invention relates to bubble domain lattice systems and more particularly to bubble domain lattice systems using multiple layers containing magnetic bubble domains.

2. Description of the Prior Art

A bubble domain system using confined arrays or lattices of bubble domains is described in copending application Ser. No. 395,336, filed Sept. 7, 1973 now abandoned. That application describes systems in which information is stored as magnetic bubble domains which occupy every bit position. Consequently, it is necessary to code information in terms of the various magnetic properties of the bubble domains themselves. For instance, one type of coding technique which is described in the above-mentioned copending application utilizes different states of wall magnetization rotation of the bubble domains. Depending upon the state of rotation of the wall magnetization of the domains, the domains can be made to deflect in different directions in a gradient magnetic field. In addition to this type of coding, other types of coding are described in that copending application.

It is sometimes difficult to code magnetic bubble domains in accordance with their magnetic properties although such coding has been demonstrated. For instance, considerable circuitry may be required and a statistical distribution of bubbles having various properties may be obtained, from which certain bubbles have to be selected. Phenomena such as dynamic conversion (i.e., change of wall configuration during wall motion) must be guarded against. Accordingly, the present invention seeks to provide a bubble domain lattice system in which information states can be coded in the conventional way (namely, the presence and absence of these domains). In order to do this, multiple magnetic layers are provided in which a complete lattice is present in one layer, while only the information bubble domains (bubbles and voids) are present in the second magnetic layer. Movement of the bubble domains in the lattice causes movement of the information domains in the adjacent magnetic layer. These information domains can be generated and sensed by conventional techniques.

Mutual interaction between bubble domains in different magnetic sheets has been described previously. For instance, reference is made to the *Conference Proceedings of the American Institute of Physics*, Proc. No. 5, 17th Annual Conf. on Magnetism and Magnetic Materials, Chicago, Ill., pg. 135. This reference article discusses movement of bubble domains in one magnetic sheet by a dragging effect due to a magnetostatically coupled bubble domain in a second magnetic sheet. Another article of interest is contained in *Philips Research Reports*, Vol. 27, No. 1, pg. 7, February 1972. In this reference, bubble domains in different magnetic media are magnetostatically coupled, and it is stated that an extreme case is that where a lattice of bubble domains is present in one of the magnetic sheets. This reference discusses crosstalk due to this magnetostatic coupling and seeks to minimize the adverse effect of this crosstalk. That is, it is not desired to utilize the magnetostatic coupling between bubble domains in two magnetic sheets, but rather to study the amount of crosstalk which results from such coupling, with a view toward designing systems where such coupling is minimal.

Another article of interest is that of Y. S. Lin, E. A. Giess, and P. J. Grundy, which appeared in Applied Physics Letters, Vol. 23, p. 485, 1973. This article also discusses two layer bubble domain structures.

Accordingly, it is a primary object of the present invention to provide bubble domain lattice systems in which conventional coding can be utilized.

It is another object of this invention to provide bubble domain lattice systems where the bubble domains in the lattice do not have to be coded in terms of their magnetic properties.

It is a further object of this invention to provide multiple layer bubble domain lattice systems.

It is another object of this invention to provide high density bubble domain lattice systems using coding in terms of presence/absence of bubble domains.

It is still another object of this invention to provide techniques for high density storage using magnetically coupled bubble domain pairs.

BRIEF SUMMARY OF THE INVENTION

Techniques are presented for providing bubble domain lattice systems wherein coding is in terms of presence/absence of magnetic bubble domains. A first magnetic layer contains a lattice of interacting magnetic bubble domains. A second magnetic layer contains the information bubble domains which are coded in terms of the presence/absence of these domains. For instance, the presence of a magnetic bubble domain could be a "1" bit while a void (no bubble domain) could be a "0" bit. The two magnetic media are arranged with respect to one another such that bubble domains in the lattice are coupled to information bubble domains in the information layer by magnetostatic or exchange forces, or by combinations of these forces. Further, this coupling is sufficient to be able to move an information bubble domain when the bubble lattice is set in motion by applied magnetic forces. Accordingly, the separation of the magnetic layers for the lattice and for the information bubble domains and the thicknesses of these layers and their material composition are such that the magnetic coupling between bubble domains in different layers is sufficient to cause this "dragging" of one bubble domain by another. Such coupling is described in more detail in the aforementioned reference articles.

Means are provided for generating a lattice of magnetic bubble domains and for moving the bubble domains in the lattice. Additionally, means are provided for generating patterns of information bubble domains in another magnetic layer, as well as for sensing these information bubble domains. Circuitry for performing various functions on the lattice bubble domains and on the information bubble domains are provided in other layers which are adjacent to the lattice magnetic layer and the information bubble domain layer. Thus, a laminar package comprising various magnetic layers and conductor layers, together with necessary insulation layers and non-magnetic layers is provided. Any type of magnetic bubble domain material can be used, although the present invention is most readily realized using amorphous magnetic materials, such as are described in copending application Ser. No. 284,513, filed Aug. 29, 1972 now abandoned. When using amorphous magnetic materials, there are no restrictions on the substrates and on the precise flatness of the various layers, as is the case with crystalline garnet bubble domain materials.

These and other objects, features and advantages will be more apparent in the following more particular description of the preferred embodiments.

DETAILED DESCRIPTION OF THE PREFERRED EMBODIMENTS

In the practice of this invention, the bit positions of a storage system are determined in accordance with the positions of bubble domains in a lattice, while the information bits are bubble domains and voids which are separate and distinct from the bubble domains comprising the lattice. However, the bubble domains which are the information bits are magnetically coupled to associated bubble domains in the lattice. This coupling is such that, if the lattice bubble domains are moved, the associated information bubble domains will also move.

Figure 1:
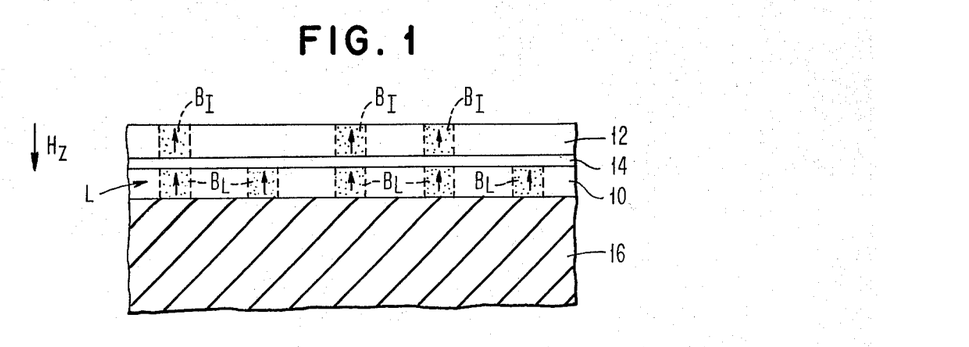
FIG. 1 is a schematic illustration of a conveyor magnetic bubble domain layer and an information bubble domain layer, where magnetostatic coupling exists between the bubble domains in the two layers.

In more detail, FIG. 1 illustrates the physical positioning of the conveyor layer 10, which contains a lattice L of bubble domains $B_L$, and an information layer 12, which contains the information bubble domains $B_I$. Layers 10 and 12 are magnetic layers which are separated by a layer 14 of non-magnetic (or weakly magnetic) material. The type of material used for layer 14 and its thickness are chosen to provide the desired coupling between domains in layers 10 and 12.

In the case of garnet bubble domain materials, the substrate 16 can be a garnet substrate while the conveyor layer and information layer are comprised of rare earth garnet materials. The non-magnetic layer 14 can also be garnet similar to that used for lattice layer 16. The substrate 16, bubble domain layers 10 and 12, and the non-magnetic layer 14 can have the same lattice constants so that the entire layered structure of FIG. 1 is an epitaxial structure.

Of course, amorphous magnetic materials can be used for the conveyor layer 10 and information layer 12. This eliminates the requirement of single crystallinity for the substrate 16 and the non-magnetic layer 14 which greatly reduces fabrication complexity. In the case of amorphous magnetic materials, the substrate can be any material, such as glass, while the non-magnetic layer 14 can also be any material, such as $SiO_2$. Additionally, circuit components (such as permalloy conductors) can be placed directly on the substrate, after which a conveyor layer is deposited. Also, a conductor or permalloy layer can be used between magnetic layers 10 and 12. Use of amorphous magnetic materials allows the designer greater freedom in using both sides of the magnetic bubble domain material for circuit structures.

In FIG. 1, the stabilizing bias field $H_z$ is shown as an arrow directed oppositely to the magnetization directions of the bubble domains (indicated by arrows within the domain boundaries). However, magnetically coupled bubble domains can be stable at very small bias fields or when no bias field $H_z$ is present. The bias field $H_z$ can be provided by a number of conventional means, such as current carrying coils or exchange coupled magnetic layers. A range of bias field can be used, including a zero magnitude bias field. Further, the thicknesses of layers 10 and 12, and their compositions can be varied to be different, in order to extend the range of $H_z$. Generally, $H_z$ is chosen to prevent run-out of information domains $B_I$.

Figure 2:
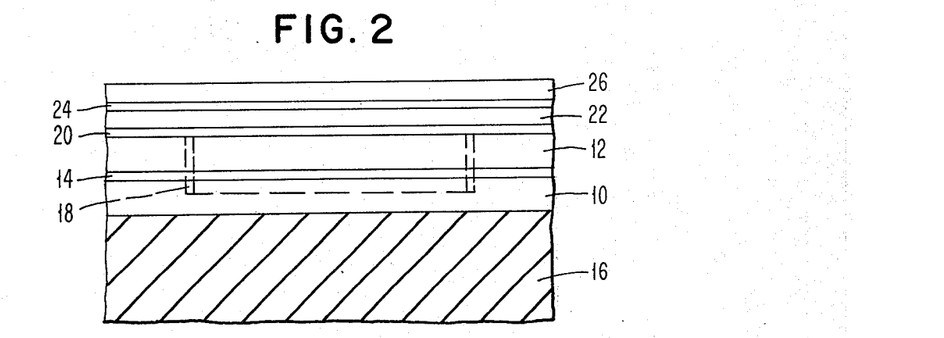
FIG. 2 illustrates the layered structure which can be used to provide the various circuit functions of the present bubble domain lattice system.

FIG. 2

FIG. 2 shows a complete package for achieving the double layer bubble structure that is used in the present invention. The conveyor layer 10, information layer 12, non-magnetic layer 14, and substrate 16 can be those which were described with reference to FIG. 1. Further, FIG. 2 shows a confinement means 18 which extends through information layer 12, non-magnetic layer 14 and into conveyor layer 10. This confinement means 18 is used to confine the lattice array of bubble domains in a manner which is described in more detail in aforementioned copending application Ser. No. 395,336. For instance, confinement 18 can be in the shape of a rhombus in order to confine a lattice of the type shown more fully in FIG. 3. To provide the confinement, information layer 12, non-magnetic layer 14, and conveyor 10 can be chemically etched to the depth shown in FIG. 2, after which a non-magnetic layer is deposited in the etched grooves. As an alternative, the confinement 18 could be provided by ion implantation of the layers as indicated. As an alternative, an additional layer comprising a current carrying conductor in the shape of the lattice could be added to the laminar package of FIG. 2.

Deposited on information layer 12 is a layer 20 which comprises the generators for forming information in layer 12 and the sensors for detecting information in layer 12. As will be seen by referring to FIG. 7, the bubble domain generators can be comprised of nucleation elements while the sensors can be provided by magnetoresistive sensing matrices.

In fabrication, the nucleating generators (which could be comprised of permalloy) and the magnetoresistive sensors (which could also be comprised of permalloy) are deposited on layer 12, after which some of the conductors which contact the generators and sensors are deposited. The composite of generators-conductors-sensors is then coated with insulation and sputter etched as desired, to provide a smooth surface for deposition of the next layer 22.

Layer 22 is comprised of various conductor patterns which are used to provide magnetic fields used in combination with the generators and sensors in layer 20. Again, reference to FIG. 7 will show this more clearly.

The conductor layer 22 can be covered with an insulation layer 24, which is typically $SiO_2$ or a similar material. The function of layer 24 is to insulate the conductors in layer 22 from those which will be formed in the next layer 26.

Layer 26 is comprised of current carrying conductors which are used to manipulate the bubble domains in the lattice. More specifically, layer 26 is comprised of conductors which are used to put bubble domains into the lattice in conveyor sheet 10, to move domains out of the lattice, and to move domains within the lattice. These conductors are shown in more detail in FIG. 3, which will be described later.

The exact arrangement of the various layers in FIG. 2 need not be exactly as shown herein. However, when using garnet bubble domain materials, it is necessary to have single crystals, and consequently the substrate and non-magnetic layer 14 will be single crystal garnet materials also. This insures that a composite comprising substrate 16 - conveyor layer 10 - non-magnetic layer 14 - information layer 12, will be an epitaxial structure.

CIRCUIT DETAILS (FIGS. 3–8)

Figure 3:
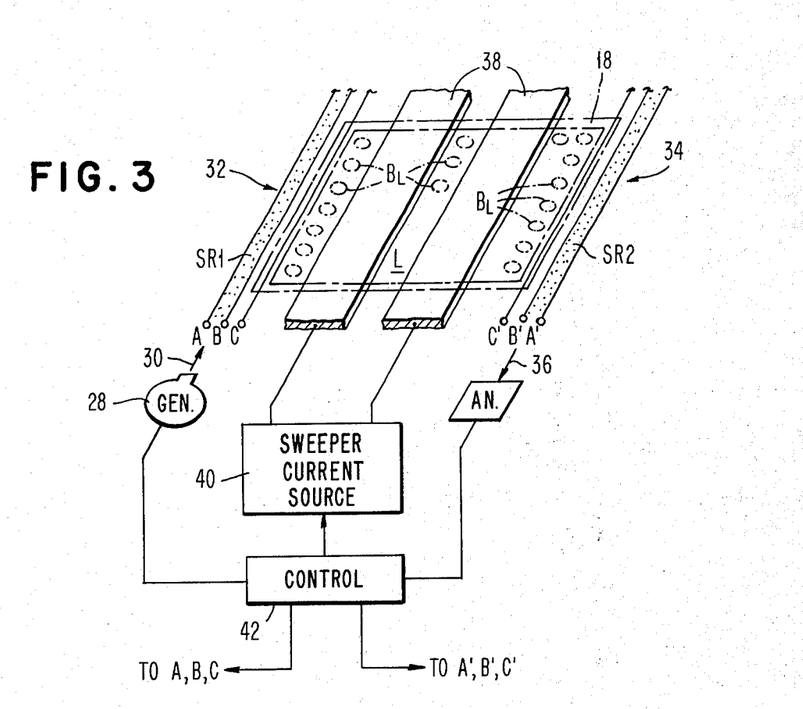
FIG. 3 illustrates the various circuits which are used to manipulate bubble domains in the lattice contained in the conveyor layer.

FIG. 3

FIG. 3 shows the circuitry which is used to manipulate bubble domains in the lattice which is present in conveyor layer 10. That is, the various lattice manipulation functions are performed by conductors which are present in layer 26 (FIG. 2).

In FIG. 3, the bubble domains $B_L$ present in the lattice L are shown in the drawing by phantom lines (circles), indicating that they are formed in a layer which is several layers removed from the lattice circuits of layer 26. Additionally, the confinement means 18 which is used to contain the domains $B_L$ within the lattice is also shown by phantom lines in this drawing. Confinement means 18 and bubble domains $B_L$ are shown in order to illustrate the alignment of the various conductor patterns of layer 26 with the confinement means 18 and the bubble domains within the lattice L.

Bubble domains are provided to lattice L from a bubble domain generator 28. This generator can be a bubble domain nucleator of the type shown in U.S. Pat. No. 3,662,359, or a bubble domain splitter/generator of the type shown in U.S. Pat. No. 3,555,527 (which requires a reorienting in-plane magnetic field). Both of these types of generators are well known and it is merely sufficient to say that they will provide magnetic bubble domains which can then be moved by shift register SR1 (indicated by the strippled region between conductors A and B) in the direction of arrow 30. Register SR1 is conveniently provided by a current carrying conductor pattern of the type shown in more detail in FIG. 5. This current carrying shift register is insulated from other conductor patterns present in layer 26.

Bubble domains from generator 28 move under influence of shift register SR1 to positions where they are outside the left-hand end of lattice L. When in these positions, the bubble domains are injected into lattice L by current pulses in conductors A, B and C, which comprise the input means 32 for moving bubble domains into lattice L. As can be seen from FIG. 3, conductor C is aligned over the left-hand end of confinement means 18, while conductors A and B are over and to the left of confinement means 18.

Figure 5:
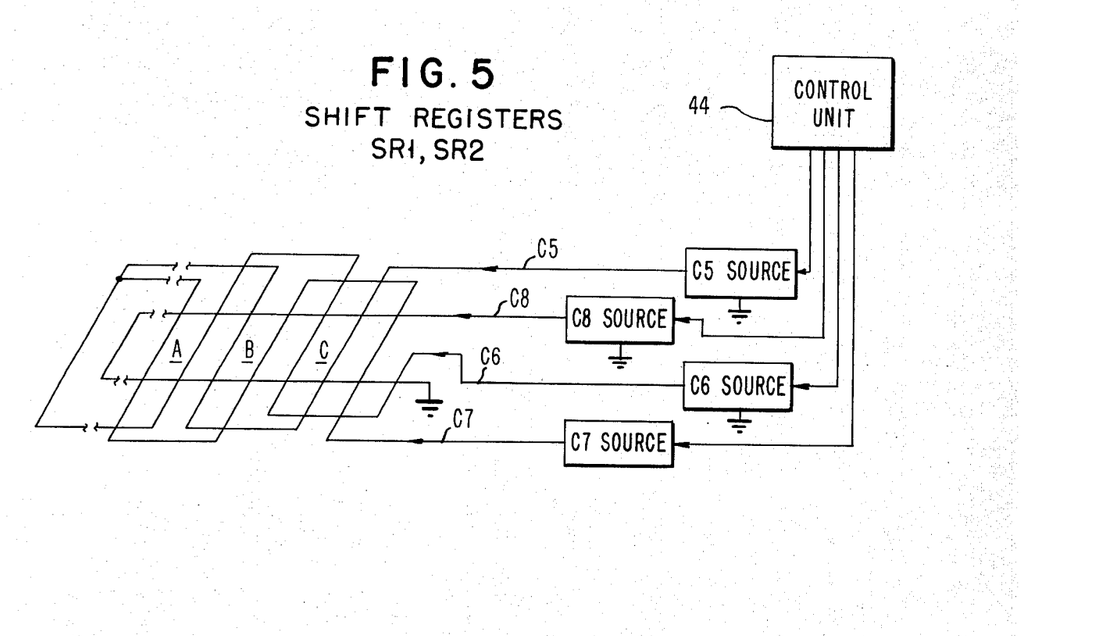
FIG. 5 is an illustration of a conductor shift register which can be used to move bubble domains in the conveyor sheet in regions outside of the lattice.

An output means, generally designated 34, is used to remove a column of bubble domains $B_L$ from the lattice area L. Output means 34 is comprised of conductors A', B' and C'. By providing the proper current pulse sequence in these conductors, bubble domains will be taken from the right-hand end of the lattice to positions between conductors A' and B'. Shift register SR2 is provided between conductors A' and B' and is shown schematically by the stippled portion of the drawing. This shift register moves bubble domains in the direction of arrow 36 toward an annihilator AN or a propagation path which returns them to register SR1 for reentry into the lattice. Register SR2 can be the same as register SR1 (FIG. 5).

When a column of bubble domains is entered into lattice L at the left-hand end thereof, this will create forces on bubble domains already within the lattice and these forces will be transmitted through the lattice and act on the last bubble domain column on the right-hand side of the lattice. Transmission of these forces can cause the rightmost column of bubble domains in the lattice to be pushed past the confinement means 18. However, the lattice is not perfectly elastic due to coercivity of the magnetic bubble domain medium 10. Therefore, a force used to inject bubbles into the lattice will not be transmitted in its entirety to the rightmost column in the lattice. For this reason, the output means is used to aid in removing bubble domains from the lattice.

In order to aid movement of magnetic bubble domains through the interior of the lattice, bubble domain sweepers 38 are provided. These sweepers are current carrying conductors which have widths approximately 2-5 times the diameter of the bubble domains. Currents in conductors 38 cause magnetic fields which couple to the bubble domains in the lattice creating a gradient field which causes the lattice bubble domains to move more readily from one end of the lattice to the other. These lattice sweepers can therefore be used to translate a lattice to the left or to the right, depending upon the direction of current flow in the sweeper conductors.

In FIG. 3, conductors 38 are connected to a sweeper current source 40 which provides current pulses therein. Also, a control unit 42 is provided which sends synchronizing control signals to the input conductors A, B, C and the output conductors A', B', and C'. Additionally, the control means 42 provides an input to the generator 28 and to the annihilator or return path used in conjunction with shift register SR2.

Thus, the circuitry in layer 26 of FIG. 2 comprises a bubble domain generator 28, a shift register SR1, a bubble domain lattice input means 32, a bubble domain lattice output means 34, and a shift register SR2. Additionally, an annihilator AN can be provided in this layer also, for collapse of magnetic bubble domains.

Figure 8:
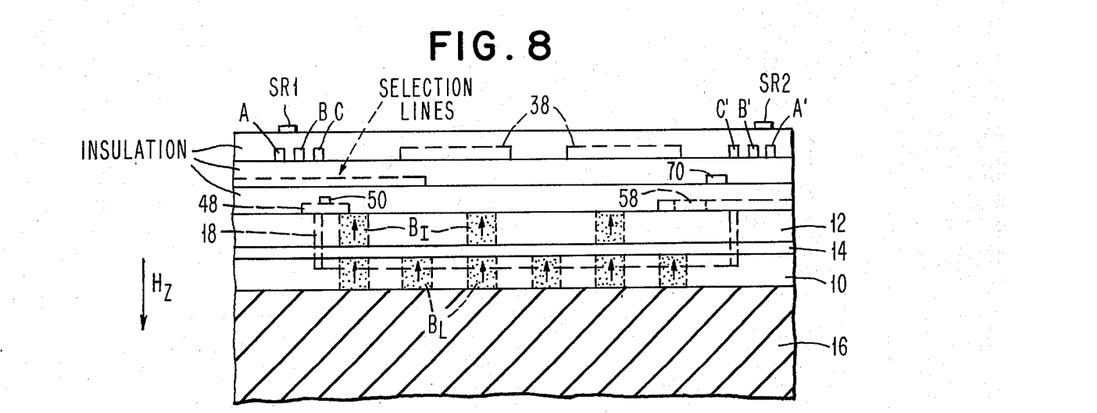
FIG. 8 is a side elevation view illustrating the arrangement of the various circuits of FIGS. 2–7 with respect to one another.

Shift registers SR1 and SR2 must be electrically insulated from the conductors A, B, C and conductors A'–C', respectively. This is easily obtained by providing the shift registers in another layer which is insulated from the layer 26, as is illustrated in FIG. 8.

FIGS. 4A–4D

These figures show the operation of the input conductors A–C and the output conductors A'–C' for various times $T = 1, 2, 3, 4$. Thus, FIGS. 4A–4D illustrate the injection of bubble domain BD1 into the lattice L and ejection of bubble domain BD2 from the lattice into shift register SR2.

As in FIG. 3, the channel between conductors A and B is stippled to indicate that shift register SR1 is located between these conductors. Similarly, the channel between conductors A' and B' is also stippled to indicate that shift register SR2 is located between those conductors.

In FIGS. 4A–4D, the current directions in the various conductors are illustrated by arrows on these conductors. For instance, at time $T = 1$, the bubble domain BD1 is to be injected into lattice L, while the bubble domain BD2 is to be removed from lattice L. Currents exist in conductors A and B in the directions indicated by the arrows. Additionally, currents are present in conductors A' and C'.

Figure 4A:
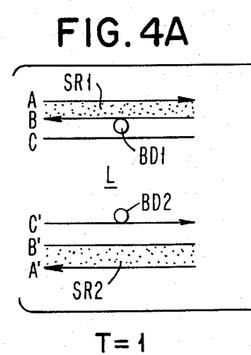
FIGS. 4A–4D illustrate the operation of the circuitry used to inject bubble domains into the lattice and to eject bubble domains from the lattice.
Figure 4B:
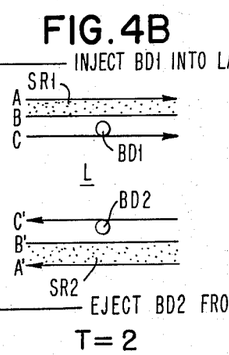

At time $T = 2$, a current is present in conductor C and also in conductor A. This causes bubble domain BD1 to move to the edge of conductor C. During time $T = 2$, currents are present in conductors A' and C', which moves bubble domain BD2 to the bottom edge of conductor C'.

Figure 4C:
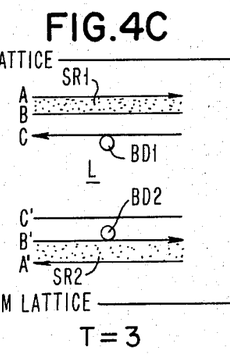
Figure 4D:
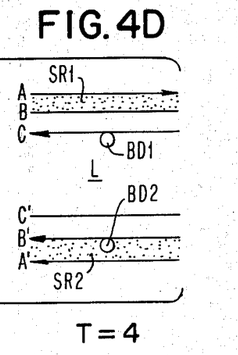

The next sequences of applied current pulses ($T = 3$ and $T = 4$) are shown in FIGS. 4C and 4D. Current pulses in the appropriate conductors produce magnetic fields which move bubble domain BD1 into lattice L and bubble domain BD2 move out of this lattice into shift register SR2.

FIG. 5

FIG. 5 shows one period of a conductor propagation pattern which can be used for shift register SR1 and SR2. This register is comprised of conductors C5, C6, C7, and C8. Conductors C5, C6, and C7 provide a three-phase conductor propagation pattern while conductor C8 is a loop which serves as a guide rail to keep the bubble domains in the proper propagation track.

Conductors C5–C8 are connected to current sources (C5 source, C6 source, etc.), as indicated in FIG. 5. These current sources receive inputs from control unit 44.

Figure 6:
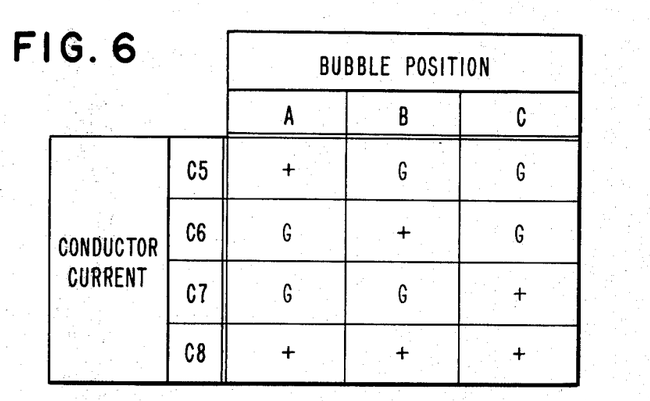
FIG. 6 is a table showing various current patterns in the register of FIG. 5 which are applied for moving bubble domains.

Sequential positions of a bubble domain during one cycle of shift register operation are designated by A, B, and C in FIG. 5. FIG. 6 shows the different currents used during one cycle of shift register operation to move a bubble domain from position A to position B to position C. In this figure, a plus sign (+) indicates that current is flowing into the indicated conductor. This current divides equally and returns through the appropriate propagation conductors, as indicated by the letter G in the table of FIG. 6. For instance, a bubble domain will move from position A to position B of the register when conductors C5 and C7 are grounded and conductors C6 and C8 have currents in them.

Figure 7:
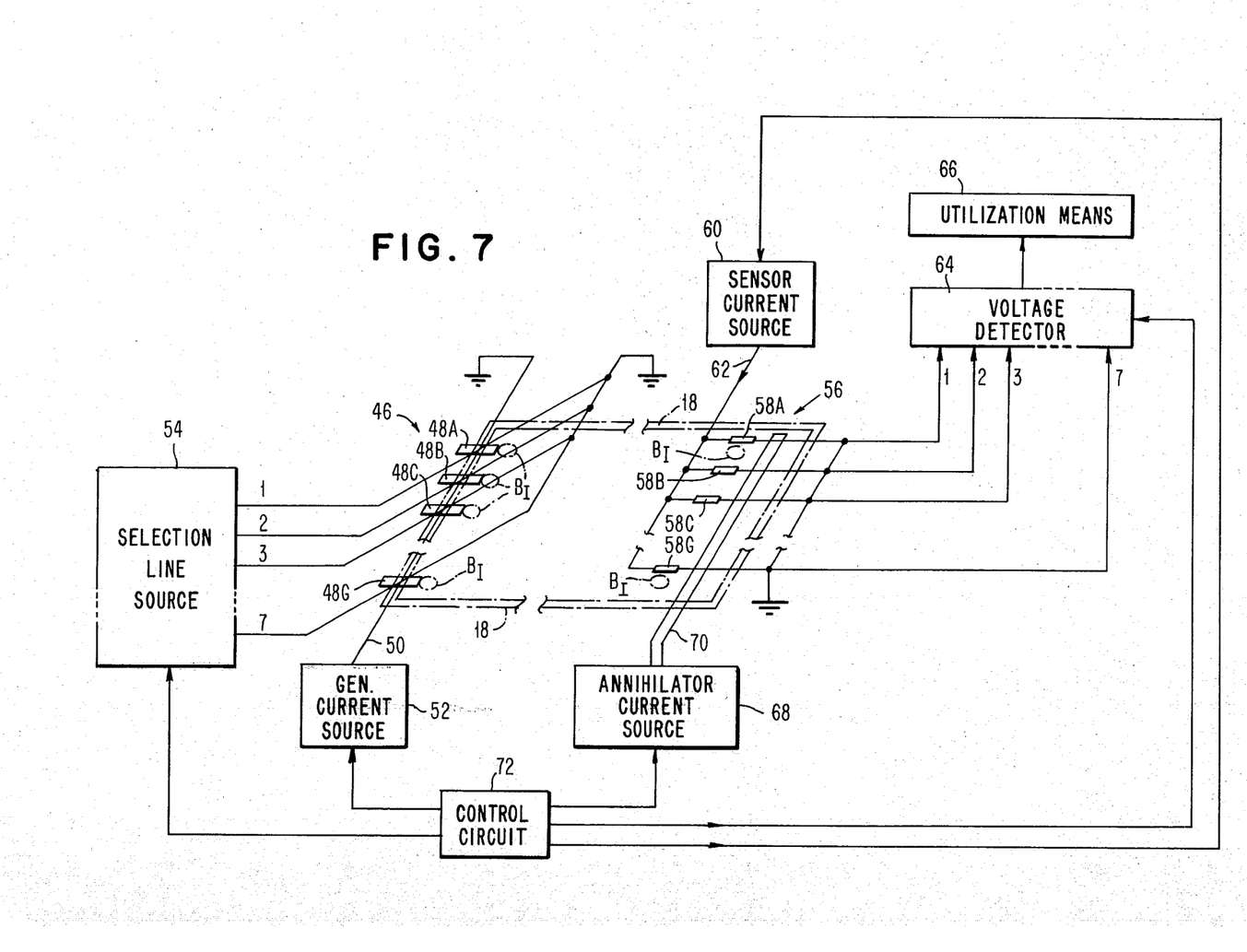
FIG. 7 is a diagram illustrating circuitry used for generation of bubble domain patterns and sensors for detecting these bubble domain patterns, where the patterns are information patterns produced in the information layer.

FIG. 7

FIG. 7 shows the circuitry which is located in layers 20 and 22 of the composite package of FIG. 2. This circuitry is used to create the desired pattern of information bubble domains and for detection of this pattern. As is the case with FIG. 3, each column of information bubbles and each column of lattice bubbles are conveniently illustrated as columns having seven bubble positions.

In more detail, FIG. 7 shows the means for generating an information pattern of bubble domains, which is generally designated by the numeral 46. Means 46 is comprised of a plurality of permalloy domain nucleators 48A, 48B, 48C, 48D, 48E, 48F, and 48G. These nucleators 48 are located in the layer 20 of FIG. 2.

A conductor 50 is deposited on the nucleators 48 and is used to provide magnetic fields at the ends of the nucleators. Conductor 50 is connected to a generator current source 52 which provides current pulses in this conductor.

A plurality of selection lines 1, 2, . . . 7 is located in layer 22 (FIG. 2). The selection lines pass over individual nucleators 48 and are used to provide magnetic fields which will aid in the nucleation of a domain by any selected nucleation generator. Currents in the selection lines are provided by selection line source 54, which is connected to each of the selection lines and which can provide current pulses in designated selection lines.

The nucleating generators 48A–48G, together with conductor 50 and selection lines 1, 2, . . . 7 are designed such that a combination of currents is required in the conductors located over each permalloy element 48 in order to be able to nucleate a domain in the information layer 18. For instance, if it is desired to nucleate a domain at the right-hand end of permalloy element 48A, a current pulse would have to be present in selection line 1 as well as in conductor 50 in order to provide a sufficient magnetic field at the right-hand end of permalloy element 48A for nucleation of a domain in information layer 18. In the same manner, application of currents in the other selection lines 2, 3, . . . 7 is used in combination with a current pulse in line 50 for selective nucleation by any of the other permalloy elements 48B–48G. Thus, a column of bubble domains or voids can be produced along the right-hand edge of the permalloy generators 48A–48G.

Nucleation of information bubble domains occurs at positions where those domains will be magnetically coupled to bubble domains in the lattice located in conveyor layer 10. In FIG. 7, three information bubble domains $B_I$ are shown in phantom lines to indicate their presence over the leftmost column of bubble domains in the lattice. Further, the confinement means 18 which is present in information layer 12 is also shown as a phantom line in order to indicate the relative locations of the various circuit components to the domains in information layer 12. Of course, the confinement means 18 in the conveyor layer 10 and the bubble domains $B_L$ in this confined area are aligned with domains in the information layer 12. Accordingly, the lattice L in layer 10 is directly below and aligned within the confinement means 18 shown in FIG. 7.

At the right-hand end of FIG. 7, the overall sensing means is generally designated 56. Sensing means 56 is comprised of a plurality of sensing elements 58A, 58B, 58C, 58D, 58E, 58F, and 58G. These sensing elements can be any type of element which is responsive to the stray magnetic field associated with information bubble domains $B_I$. In a preferred embodiment, they will be magnetoresistive sensing elements comprised of a material such as permalloy. Accordingly, the individual sensing elements 58A–58G can be comprised of the same material as the nucleating elements 48A–48G. Because of this, they can be formed by the same deposition step, which leads to increased ease of fabrication and alignment.

The individual sensing elements 58A–58G are connected to a sensor current source 60 which provides current in conductor 62, in which current divides and flows through each of the sensing elements 58A–58G. A voltage detector 64 measures the difference in voltage across each of the sensors 58A–58G when a current is put through these sensors. In a well known manner, the presence of an information bubble domain $B_I$ in flux coupling proximity to a magnetoresistive sensor will cause a change in resistance of the sensor which can be indicated as a voltage change across the sensor. These voltage changes are sensed by the detector 64 which can then send the signals to a utilization means 66, which could be a computer or other circuitry.

In operation, the sensors 58A–58G are responsive to individual information bubbles in a column of bubble domains in the information layer. For example, nucleation generator 48A will produce bubble domains or voids which are detected at a later time by sensor 58A. The bubble domains produced by the nucleation generators 48A–48G are propagated to the sensing means 56 when the magnetically coupled lattice domains $B_L$ are moved to the right to positions where the associated magnetically coupled information domains will be in flux coupling proximity to the sensors 58A–58G.

An annihilator current source 68 provides current pulses in conductor loop 70 for annihilation of domains after they are sensed by the elements 58A–58G. However, the information domains can be returned to the input end of the information area and can be put into storage again, using conductors (not shown) such as those which move bubble domains into and out of the lattice.

The control circuit 72 is used to synchronize operation of the various circuitry used to manipulate the domains $B_I$ in information layer 12. Control circuit 72 provides synchronizing inputs to selection line source 54, generator current source 52, annihilator current source 68, sensor current source 60, and voltage detector 64. Additionally, control circuit 72 will be phased in synchronization with the control circuit 42 (FIG. 3) which is used to synchronize the operation of the circuits associated with the lattice of bubble domains $B_L$ in conveyor layer 10.

FIG. 8

FIG. 8 is a side elevational view showing the alignment of various circuit components with respect to bubble domains in the information layer 12 and bubble domains in the conveyor layer 10. This is one possible arrangement of circuit functions, although other arrangements can be easily developed by those having skill in this art.

In FIG. 8, bubble domains $B_L$ are present in the lattice while information domains $B_I$ are magnetically coupled to the lattice bubble domains. Accordingly, generators 48A–48G (illustrated herein as generators 48) produce information domains $B_I$ at positions where they will be magnetically coupled to lattice domains $B_L$ at the left-hand side of the lattice. Conductor 50 is located over generators 48. In the same manner, sensors 58A–58G (indicated here by the numeral 58) are located at the right-hand end of the drawing. Generators 48 and sensors 58 are located in the layer 20, the remaining portion of which is comprised of insulation.

In the next layer 22, the various selection lines 1–7 are provided as well as the annihilator loop 70. The rest of layer 22 is comprised of insulation. As is apparent from this drawing, the selection lines and conductor 50 are located over the generators 48 in order to provide magnetic fields which couple to the generators 48. Annihilator 70 is located in a position where it can be used to annihilate domains after they have been sensed by elements 58.

The next layer 26 includes the lattice manipulation circuits, such as input conductors A–C, output conductors A'–C', and lattice sweeper conductors 38. The remainder of layer 26 is comprised of insulation.

The top-most circuits are the shift registers SR1 and SR2 which are used to move domains in conveyor layer 10 to positions where they can be put into the lattice, or which move domains that have been removed from the lattice.

The bias field $H_z$ can be provided by a current carrying coil which surrounds the entire structure in a manner which is well known in the art. Additionally, a permanent magnet or exchange coupled magnetic layers can be used.

What has been shown is a bubble domain lattice system which does not require the use of coded bubble domains in a lattice of bubble domains. Instead, the bubble domains in the lattice are used as conveyors of information bubble domains which are located in another magnetic layer. These information bubble domains can be coded in terms of their presence and absence, or any other way, thereby relieving the necessity for additional lattice circuitry.

It will be apparent to those skilled in the art that variations in the particular structures shown can be utilized. For instance, different components can be used for generation and sensing of information bubble domains, and the materials comprising the bubble domain layers can be varied. Additionally, the circuitry used to manipulate the bubble domain lattice can be varied to provide different types of lattice operation.

What is claimed is:

1. An apparatus using magnetic bubble domains, comprising:
    a first magnetic medium and confinement means for confining domains therein in a two-dimensional lattice of interacting magnetic bubble domains, the interdomain spacings in said lattice being substantially determined by interactions between said domains and by said confinement means,
    a second magnetic medium,
    means for producing an information bit pattern of bubble domains and voids in said second magnetic medium in positions where said bubble domains in said second magnetic medium are magnetically coupled to bubble domains in said first magnetic medium, the spacings between said bits in said second medium being substantially determined by the interdomain spacings in said lattice,
    means for moving said bubble domains in said information bit pattern, comprising further means for moving domains in said lattice across said confinement means to thereby move said information bit pattern of domains by said magnetic coupling, and
    means for sensing said bubble domains in said second magnetic medium.

2. The apparatus of claim 1, further including means for moving magnetic bubble domains out of said two-dimensional lattice of magnetic bubble domains.

3. The apparatus of claim 2, including further means for moving magnetic bubble domains within said lattice.

4. The apparatus of claim 3, where said sensing means includes a plurality of sensing elements which are responsive to the stray magnetic fields of bubble domains in said second magnetic medium.

5. An apparatus using magnetic bubble domains, comprising:
   a first magnetic medium and a confinement means for confining a two-dimensional lattice of columns of magnetic bubble domains therein, the positions of bubble domains within said lattice being substantially determined by interactions therebetween, and by said confinement means which is a boundary of said lattice,
   a second magnetic medium with a coded pattern of magnetic bubble domains therein which are magnetically coupled to domains in said lattice, each said domain in said coded pattern being coupled to a different one of said domains in said lattice,
   means for moving columns of bubble domains in said lattice, to thereby drag columns of magnetically coupled bubble domains in said coded pattern,
   means for producing said coded pattern of bubble domains in said second magnetic medium,
   means for sensing bubble domains in said coded pattern of bubble domains.

6. The apparatus of claim 5, including input means for placing bubble domains into said lattice and output means for removing bubble domains from said lattice.

7. The apparatus of claim 5, in which said means for producing said pattern of bubble domains is comprised of a plurality of bubble domain generators which can be selectively activated to produce bubble domains, and said means for sensing domains includes a plurality of sensing elements responsive to the stray magnetic fields of bubble domains in said pattern.

8. An apparatus for magnetic bubble domains, comprising:
   a first magnetic medium having a plurality of magnetic domains therein which are in a two-dimensional confined area, said magnetic domains interacting with one another in said confined area to form a two-dimensional lattice of aligned rows and columns of said domains,
   confinement means for confining said domains within said area,
   a second magnetic medium having a coded pattern of magnetic bubble domains and voids therein for representation of information, each of said bubble domains in said second medium being magnetically coupled to a magnetic domain in said first medium,
   means for translating columns of said magnetic domains in said first medium in a direction transverse to the length of said columns thereby causing corresponding movement of columns of magnetically coupled bubble domains in said second medium,
   means for producing said coded pattern of bubble domains in said second magnetic medium, and
   means for reading said information in said second magnetic medium in accordance with the presence and absence of domains in said coded pattern.

9. The apparatus of claim 8, further including means for moving magnetic domains into and out of said two dimensional confined area in said first magnetic medium.

* * * * *